United States Patent [19]

Takahashi et al.

[11] Patent Number: 5,679,008

[45] Date of Patent: Oct. 21, 1997

[54] ELECTRICAL CONNECTOR

[75] Inventors: Hisafumi Takahashi, Tokyo; Kouichi Uchiyama, Tama, both of Japan

[73] Assignee: Kel Corporation, Tokyo, Japan

[21] Appl. No.: 570,386

[22] Filed: Dec. 11, 1995

[30]   Foreign Application Priority Data

Dec. 15, 1994  [JP]  Japan ................... 6-333296

[51] Int. Cl.⁶ ............................................. H01R 9/09
[52] U.S. Cl. ...................... 439/76.1; 439/579; 439/497
[58] Field of Search ........................... 439/76.1, 497, 439/579, 581, 79

[56]   References Cited

U.S. PATENT DOCUMENTS

| | | | |
|---|---|---|---|
| 4,157,612 | 6/1979 | Rainal | 439/497 |
| 4,613,193 | 9/1986 | Beers | 439/59 |
| 4,736,275 | 4/1988 | Kendall et al. | 439/59 |
| 4,808,115 | 2/1989 | Norton et al. | 439/248 |
| 4,867,704 | 9/1989 | Standke | 439/581 |
| 5,122,065 | 6/1992 | Dudek et al. | 439/76.1 |

*Primary Examiner*—Neil Abrams
*Assistant Examiner*—T. C. Patel
*Attorney, Agent, or Firm*—Robert W. J. Usher

[57] ABSTRACT

An electrical connector 1 comprises a mediate circuit board assembly 4, a housing 2, and a plurality of contacts 3. The mediate circuit board assembly 4 has a plurality of signal paths, to which signal cables 5 are connected, and the housing 2 houses this mediate circuit board assembly 4. The contacts 3 are retained in the housing 2 and connected to the signal paths of the mediate circuit board assembly 4, which is housed in the housing 2. Two double-sided circuit boards, each having at least the signal paths formed on the front face and a grounding path formed on the rear face, constitute the mediate circuit board assembly 4 when these two double-sided circuit boards are abutted with each other, connecting the grounding paths of their rear faces.

5 Claims, 7 Drawing Sheets

ELECTRICAL CONNECTOR

FIELD OF THE INVENTION

The present invention relates to an electrical connector for terminating common end portions of individual conductors of a series of coaxial cables and for providing matable connection thereof as a single unit to respective circuitry.

BACKGROUND OF THE INVENTION

A prior art connector of such type comprises an insulating housing having a wire receiving face and a mating face, a mediate circuit board having series of signal paths for terminating respective conductors and extending between the faces and, a plurality of contacts anchored in the housing and connecting the mediate circuit board to the mating face.

Figure 8:
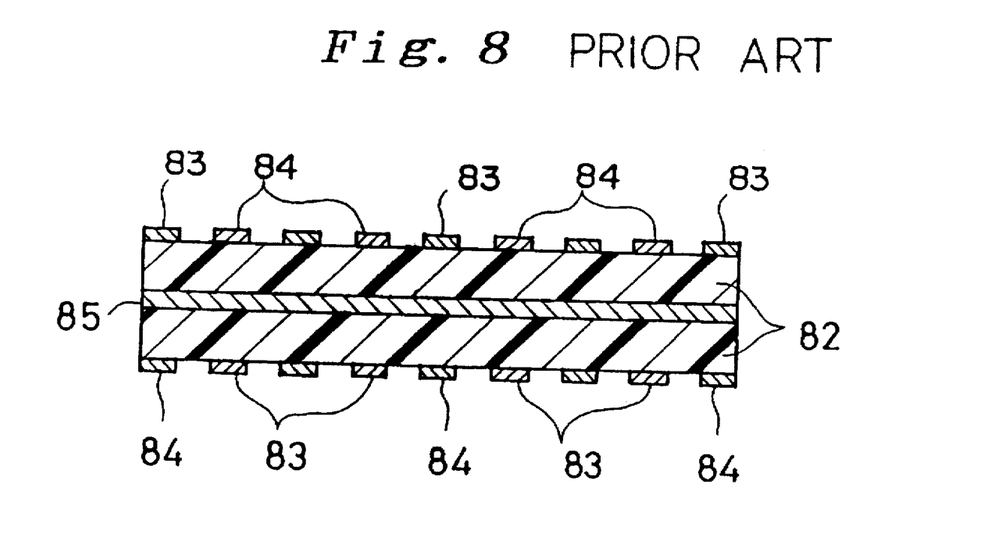
FIG. 8 is a sectional view of a mediate circuit board according to the prior art.

The mediate circuit board is often a three-layer circuit board, i.e., a circuit board with three conductive layers. For example, the one-piece, three-layer circuit board shown in FIG. 8, includes two insulation layers 82, a grounding layer 85 formed therebetween, and two conductive layers defining alternately arranged, signal and ground paths 83 and 84, respectively, on the respective remote outer faces of the insulation layers 82. The core signal wires of coaxial cables are soldered to respective signal paths 83. Each grounding path 84 adjacent each signal path 83 on the insulation layers 82 is grounded together with the grounding layer 85 so as to prevent cross-talk among signals transmitted along the signal paths 83.

To avoid impedance mismatch between this connector and the electrical equipment to which the connector is connected, it is necessary for the impedance of the signal paths of the mediate circuit board to be adjustable. For high-speed signal transmission, a very significant improvement in the transmission characteristics of the mediate circuit board is necessary. To this end, it is usual to rearrange or modify the signal and grounding paths 83 and 84 or the thicknesses of the insulation layers 82 thereby to alter the impedance, etc. of the mediate circuit board.

However, the manufacture of a multilayer mediate circuit board having three or even more layers requires many fabrication or processing steps which results in a problematically high production cost. Since rearranging circuit pattern is costly, manufacturers often forego such step, while the size of the existing housing of the mediate circuit board imposes a limit on the thickness of the insulation layers when attempting to adjust the impedance by increasing the thickness of the insulation layers. As a result, it is only possible to adjust the impedance of the mediate circuit board within a small range.

SUMMARY OF THE INVENTION

The present invention was conceived to solve these problems.

An object of this present invention is to provide an electrical connector which permits impedance adjustment over a wide range in addition to other variations, and which can be manufactured at low cost.

Another object of the present invention is to provide an electrical connector which permits the impedance thereof to be easily adjusted by accommodating modifications to the circuit pattern of signal paths and grounding paths.

In order to attain these objects, the present invention provides an electrical connector comprising a mediate circuit board assembly constituted of two double-sided circuit boards, each board having at least signal paths formed on the front face and a grounding path formed on the rear face. These two double-sided circuit boards are abutted with each other with grounding paths of each board contacting each other to form the mediate circuit board assembly.

Thus, an equivalent to the prior three-layer circuit board for use as the mediate circuit board assembly is constructed by abutting two double-sided circuit boards, which are not expensive to produce. Consequently, the production cost of the mediate circuit board assembly is maintained low. As a result, rearrangement of the circuit patterns for the mediate circuit to adjust the impedance and improve the transmission characteristics of the mediate circuit board assembly can be carried out in a cost effective manner.

Furthermore, the mediate circuit board assembly may be constructed by placing a metal plate, an insulating plate, or a conducting plate between the above two double-sided circuit boards, the conducting plate being formed by covering the front face, etc. of an insulating plate with a conductive layer. Alternatively, the assembly may be similarly constructed by placing a metal plate, an insulation plate, or a conductive plate between two single-sided circuit boards, each board having at least signal paths formed on the front face and mounted with rear faces facing each other.

Using this technique, multi-layer mediate circuit board assemblies are also easily formed by only abutting two circuit boards and a metal plate, etc. The impedance of the connector can be adjusted over a wide range in accordance with the types of plates interposed between the circuit boards.

DESCRIPTION OF THE PREFERRED EMBODIMENTS

Figure 1:
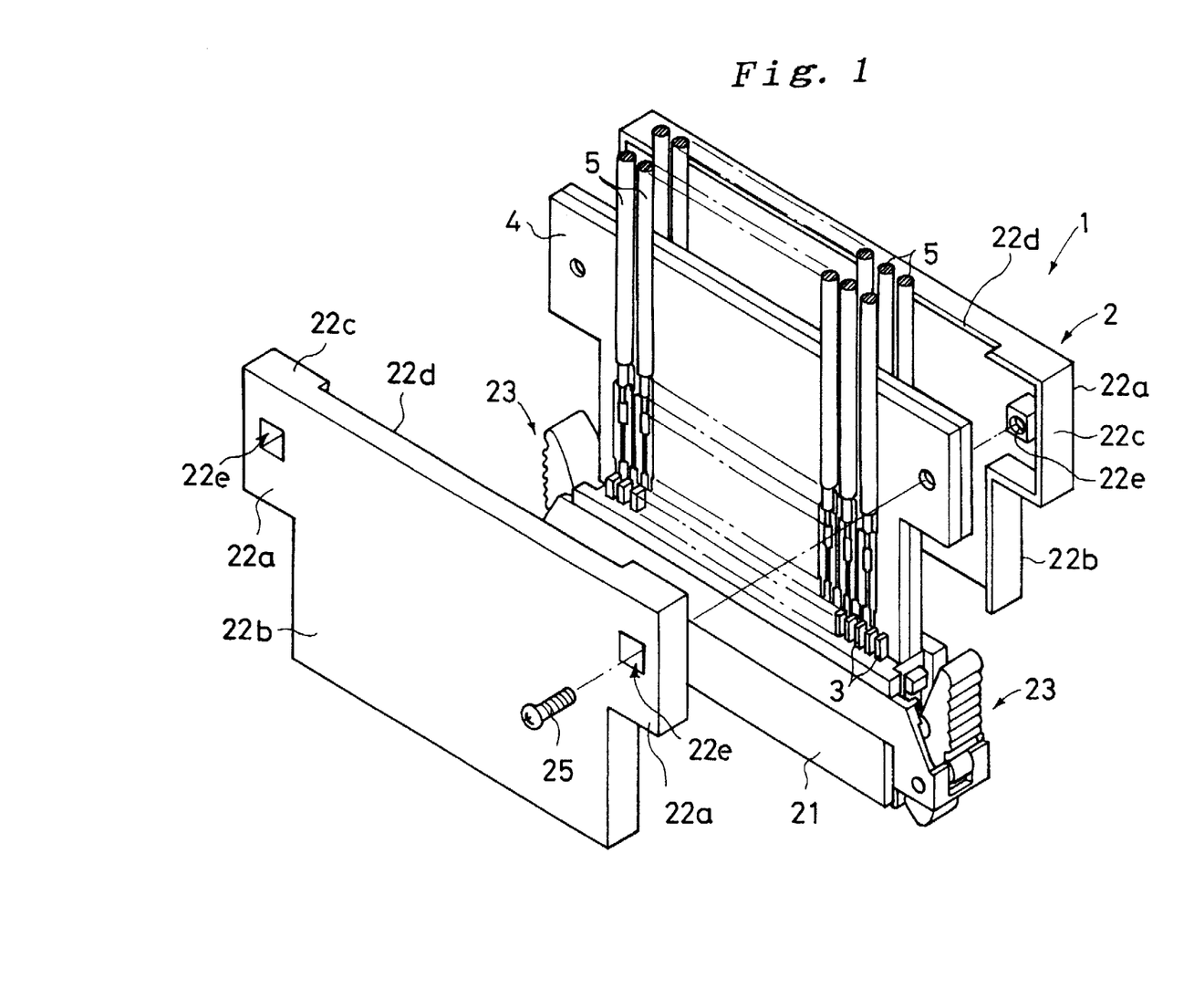
FIG. 1 is a perspective, partly exploded view of an electrical connector as a preferred embodiment of the present invention.

As shown in FIG. 1, the first embodiment of electrical connector 1 terminates common end portions of a series of coaxial cables 5 and comprises a housing 2 formed of an insulative resin, a plurality of contacts 3 retained therein, and a mediate circuit board assembly 4 in the housing 2 and connected to the coaxial cables 5.

The housing 2 comprises three portions; a generally rectanguloid mating portion 21 for mating with a complementary connector, (not shown in the drawings), and two circuit-board housing half-shells 22, which extend away from the mating portion.

Figure 2:
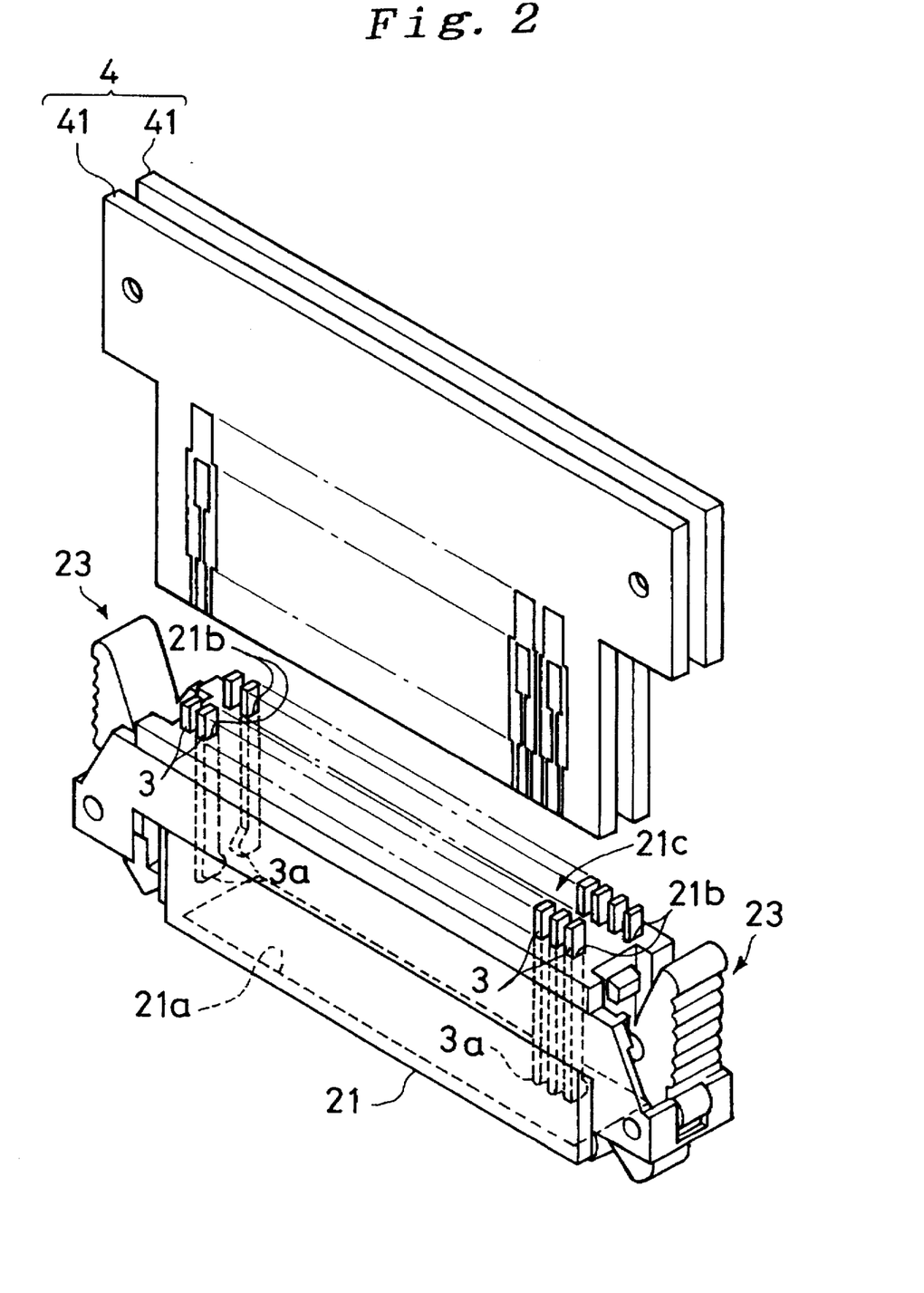
FIG. 2 is an exploded view of the lower part of the housing and the mediate circuit board assembly of the electrical connector.
Figure 5:
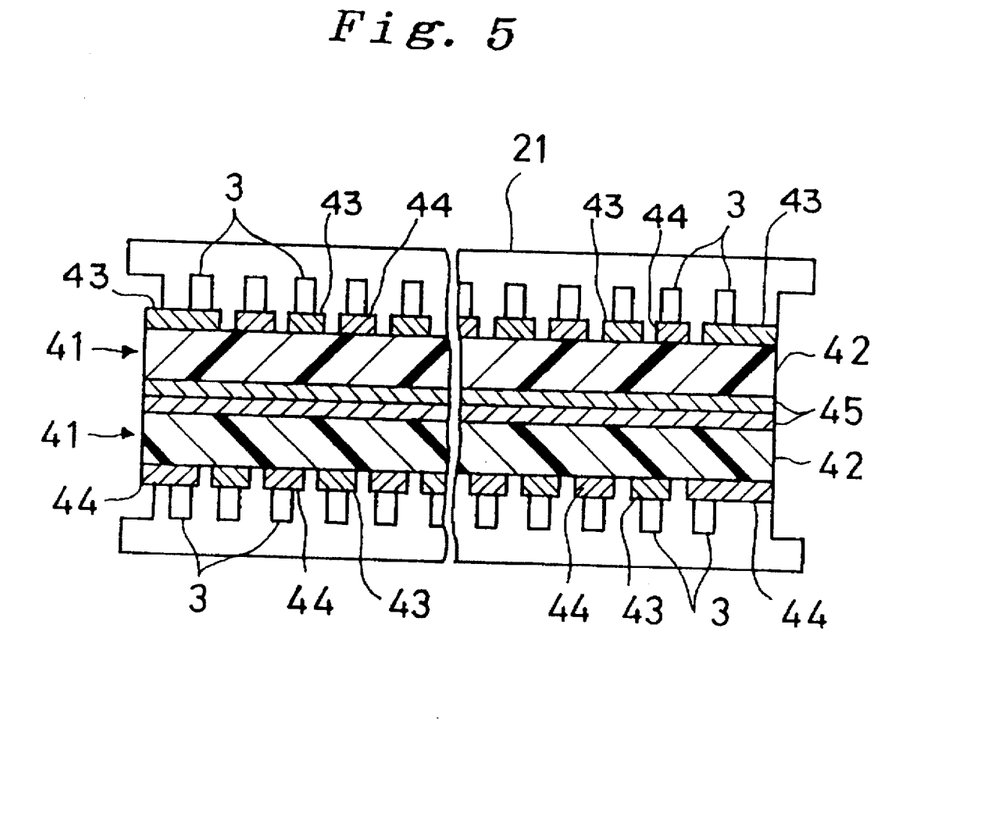
FIG. 5 is a sectional view of the mediate circuit board assembly assembled in the housing.

As shown in broken lines in FIG. 2, the mating portion 1 is formed with a mating cavity 21a opening to a leading mating face thereof. Two, transverse rows of contact receiving passageways 21b are formed in the mating portion with individual passageways extending in the mating direction between a trailing face thereof and the mating cavity 21a. The contacts 3 are force fitted into respective passageways 21b (e.g. by stitching) so that upper ends of the contacts 3 protrude above the trailing face of the mating portion 21 by a predetermined extent so that the two rows define between them a board receiving slot or groove 21c. The contacts 3 are in staggered relation, longitudinally of the rows, as shown in FIG. 5. The mating portions of the contacts 3 protrude into the mating cavity 21a, to establish connection with corresponding contacts of a mating connector inserted into the mating cavity 21a. Locking mechanisms 23 of known type are provided on opposite transverse or longitudinal ends of the mating portion 21 for retaining a mating connector so connected.

As shown in FIG. 1, each circuit-board housing half-shell 22 has a planar, T-shape base wall, having arm portions 22a extending transversely from opposite sides of a trailing, cable receiving end of a central main portion 22b extending in the mating direction, and is surrounded on all sides except a leading, contact receiving end, by a peripheral, flange-like peripheral wall 22c. The wall 22c is formed with a rebate or cut-out 22d at the trailing, providing a slot form, cable receiving opening at the trailing end and a contact receiving opening at the leading end, when the circuit-board housing shells 22 are assembled together with free edges of their sidewalls in abutment. A screw-receiving hole 22e is formed in each abutment for receipt of assembly screws 25.

As shown in FIG. 2, the mediate circuit-board assembly 4 is constructed from two double-sided circuit boards 41. Each double-sided circuit board 41 is formed with two conductive layers on respective opposite front and rear faces of a plate-like insulation layer, as shown in FIG. 3B. These layers consist of a circuit pattern including a signal pattern 43 and a grounding pattern 44 (hereinafter referred to as the front grounding pattern), formed on the front face of a plate-like insulation layer 42, and a grounding pattern 45 (hereinafter referred to as the rear grounding pattern) formed on the rear face of the insulation layer 42.

Figure 3A:
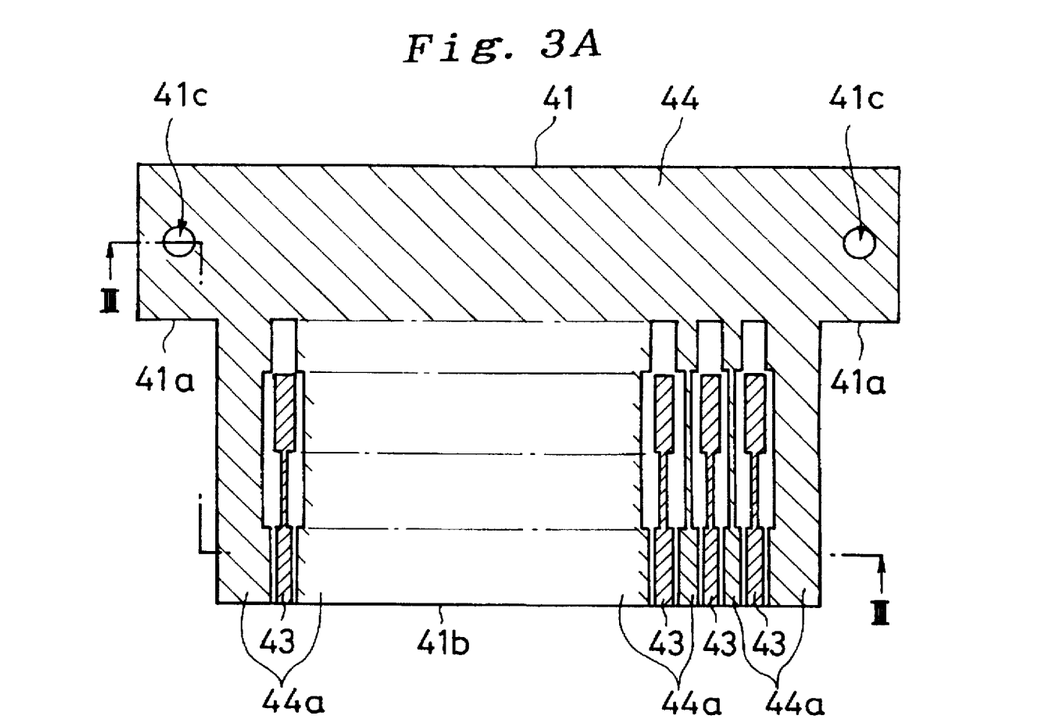
FIG. 3A is a plan view of a double-sided circuit board, two of which together constitute the mediate circuit board assembly shown in FIGS. 1 and 2.
Figure 3B:
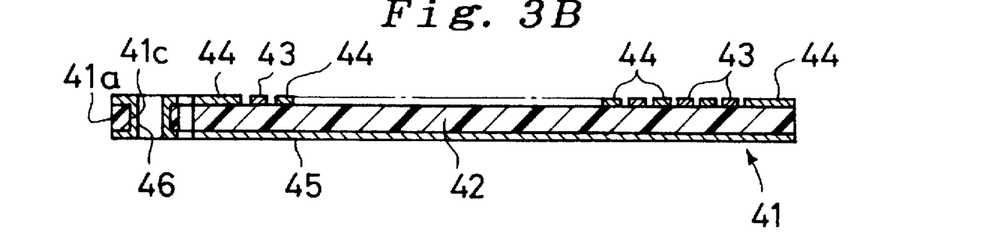
FIG. 3B is a sectional view of the double-sided circuit board, taken along line III—III in FIG. 3A.

The insulation layer 42 is formed as a T-shape plate, as shown in FIG. 3A, with transverse arm portions 41a formed with assembly screw receiving through-holes 41c, and a central main portion 41b, in positions corresponding to those of the half-shells. The grounding pattern 44 covers the surfaces of and between both arm portions 41a and has paths 44a extending forward in laterally spaced apart relation over the face of the main portion 41b in a comb-like fashion. Each forwardly extending path 44a has a central or middle portion of markedly reduced width. Signal paths of the signal pattern 43 are formed in the spaces between the paths of the comb-like pattern 44a on the main portion 41b, interdigitating with the grounding paths so that the signal paths and the grounding paths are in alternating positions. Each signal path extends forward from a trailing most end of a portion of the grounding path of reduced width, and also has a central or middle portion of markedly reduced width, forming a dumbbell-like profile.

The grounding pattern 45 is a continuous conductive layer which covers the entire rear face of the insulation layer 42, as shown in FIG. 3B and joins a portion 46 lining through-hole 41c, so that the grounding pattern 44 is electrically connected with the rear grounding pattern 45 providing a common grounding condition.

Figure 4:
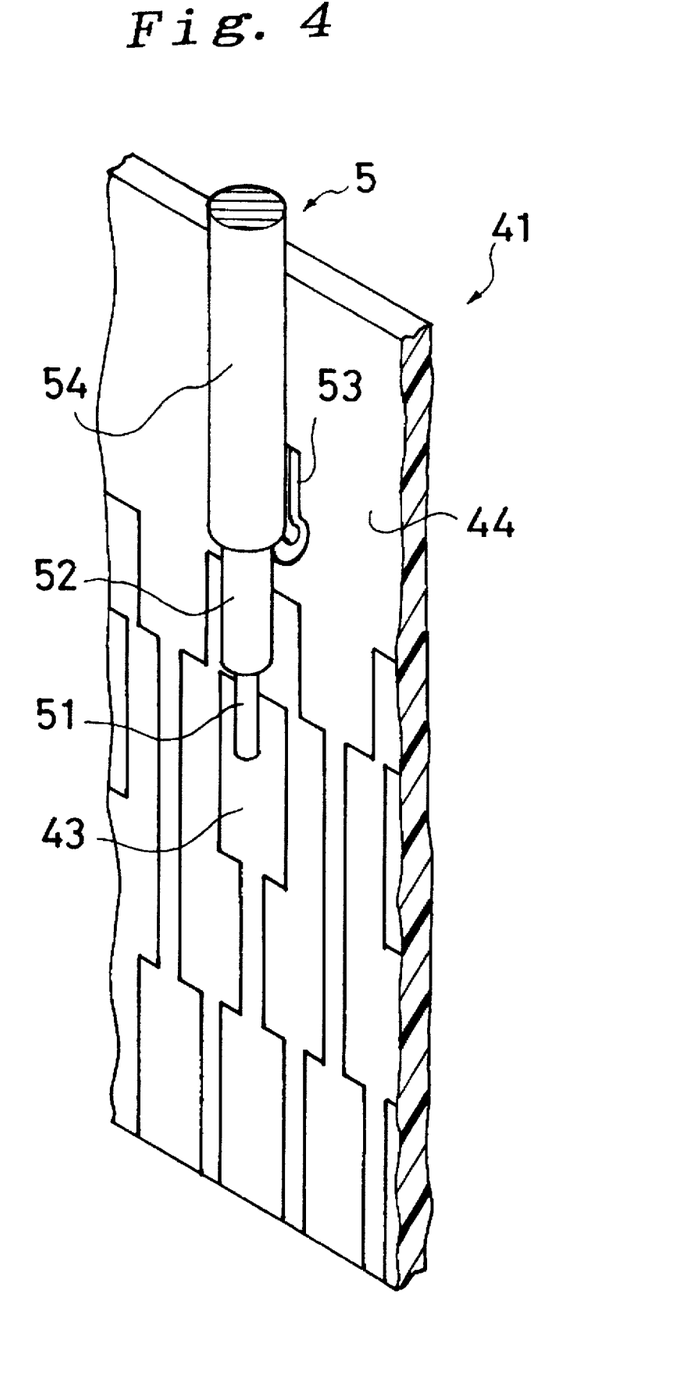
FIG. 4 is a fragmentary perspective view of the mediate circuit board assembly terminating a coaxial cable.

As shown in FIGS. 1 and 4, a series of coaxial cables 5 are connected to the circuit boards 41. Each coaxial cable 5 comprises a core, signal wire 51 surrounded by insulation 52, a braided outer conductor 53 which surrounds the spacing insulator 52 and is covered by an outermost vinyl jacket 54. The end portion of the core wire 51 of each coaxial cable 5 is stripped for a predetermined length, and a predetermined length of the end portion of the braided conductor 53 is bundled and reversely bent so that it is separated from the insulator 52 and extends behind the vinyl jacket 54.

The reversely bent portion of the braided outer conductor 53 of each coaxial cable 5 is soldered onto the trailing portion of a respective path of the face grounding pattern 44, and the stripped portion of the core wire 51 is soldered onto the trailing portion of a respective path of the signal pattern 43, thereby connecting or terminating the coaxial cables 5 to the circuit boards 41. It is preferable that the vinyl jackets 54 of the coaxial cables 5 are fixed to the circuit boards 41 with epoxy resin in order to reinforce the attachment of the coaxial cables 5, providing strain relief.

The mediate board assembly is erected by abutting rear faces i.e. rear grounding patterns 45 of two circuit boards 41 terminating a series of coaxial cables 5, as described above, to create a single or common grounding layer 45 between the two insulation layers 42, thereby forming, in effect, a three-layer mediate circuit board assembly.

A circuit board with two conductive layers, i.e., a double-sided circuit board similar to the circuit board 41, is fabricated relatively easily and at relatively low cost enabling a corresponding reduction in the cost of the mediate circuit board 4 assembly so that the overall cost of manufacturing this electrical connector 1 is maintained relatively low.

In assembling the connector, the mediate circuit board assembly 4 is force fitted into the groove 21c between the two rows of contacts 3, as shown in FIGS. 1 and 5 forming a sub- assembly in which each contact 3 electrically connects with a respective signal path of the signal pattern 43 or a grounding path of the grounding pattern 44. (The contacts 3 connecting to the signal and ground paths are hereinafter referred to as signal and grounding contacts, respectively.)

The circuit-board housing half-shells 22, are then abutted together about the sub assembly and secured thereto by the screws 25 received in the screw holes 22e and the through-holes 41c of the mediate circuit board assembly 4.

Figure 6:
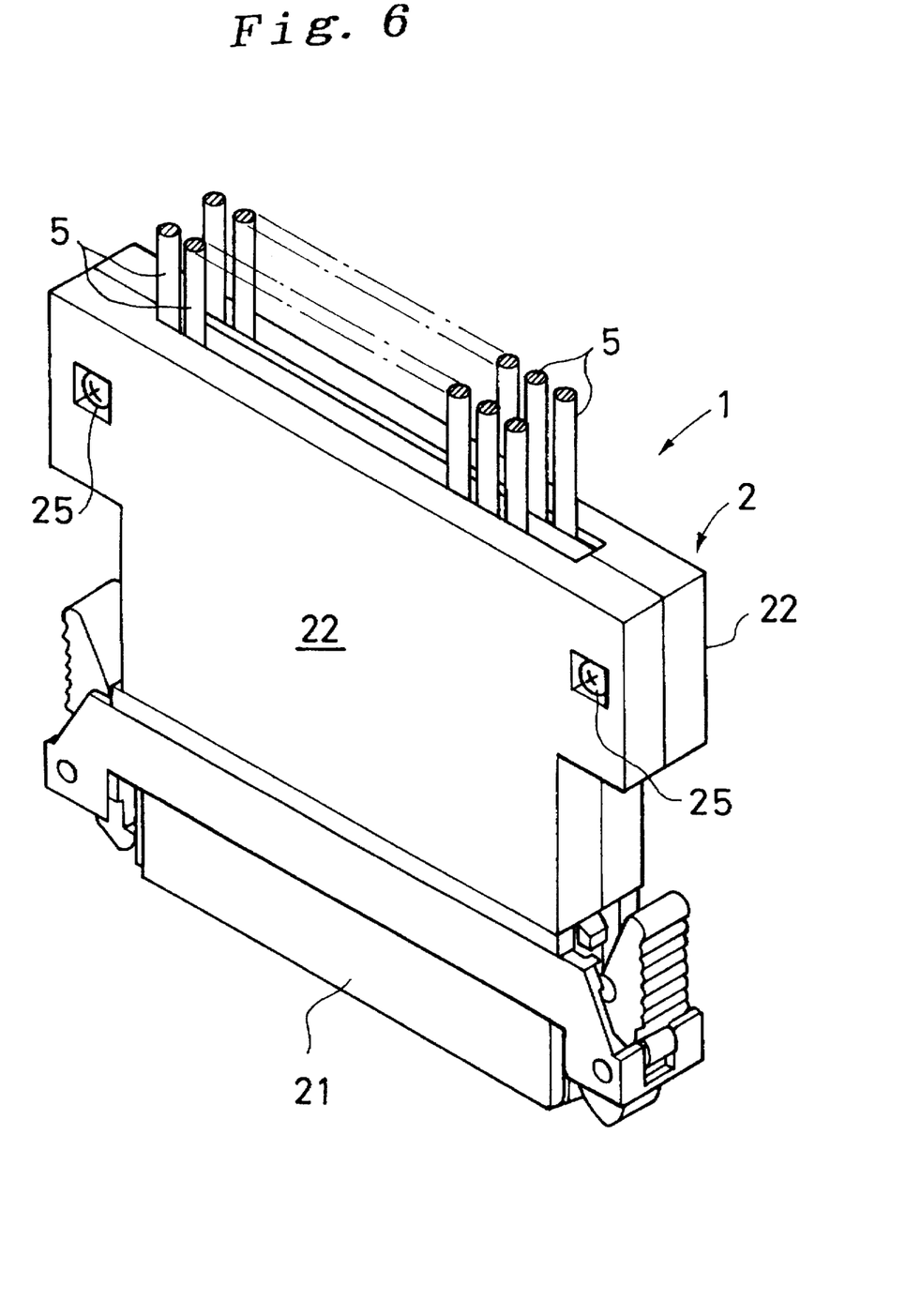
FIG. 6 is a perspective view of the electrical connector terminating a series of coaxial cables.

As shown in FIG. 6, in the completed assembly, the coaxial cables 5 extend through the slit-like opening defined by the rebates 22d. Electrical signals transmitted through core wires 51 of the coaxial cables 5 flow through the signal pattern 43 of the mediate circuit board assembly 4 into corresponding contacts 3, when the contacts 3 are connected with the contacts of a mating connector. As the grounding patterns 44 and 45 having grounding paths traced between the respective signal paths are grounded through grounding contacts 3, cross-talk is prevented among the signals being transmitted through the signal paths of the signal pattern 43. The circuit-board housing shells 22 are lined with a metal film, not shown in the figure, as an electromagnetic shield to prevent noise external noise from affecting the mediate circuit board assembly 4.

When high-speed signals are transmitted through the coaxial cables 5, it is important that the impedance or transmission characteristics of the signal pattern 43 be adjusted in order to prevent an impedance mismatch with any equipment which is connected through this connector 1.

Figures 7A, 7B:
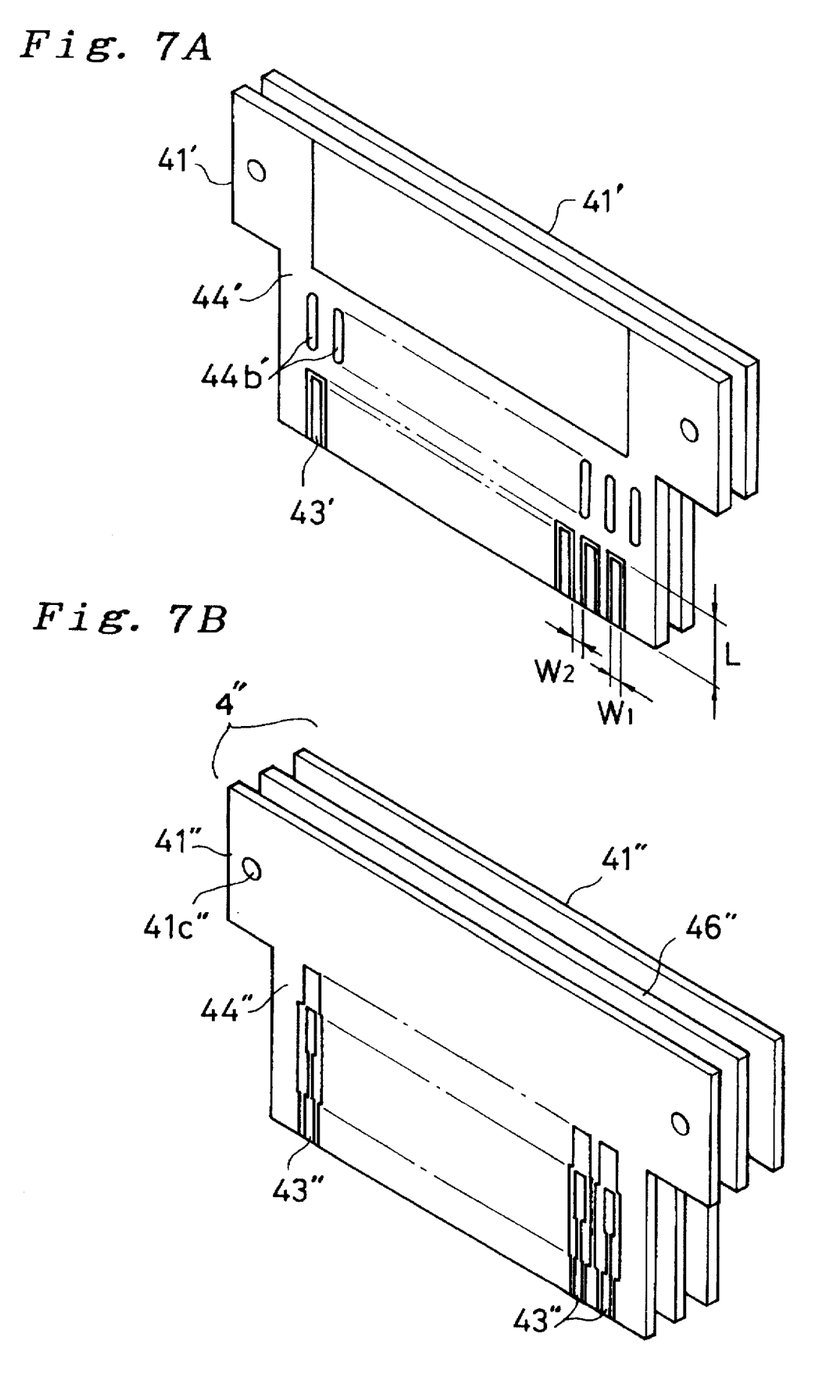
FIG. 7A is a perspective view of a second embodiment of the mediate circuit board assembly.
FIG. 7B is a perspective view of a third embodiment of the mediate circuit board assembly.

As shown in FIG. 7A, for example, by modifying the layout of the patterns 43' and 44', the impedance and transmission characteristics of the signal paths of the signal pattern 43' can be adjusted. Specifically, by reducing the width W1 of the signal pattern 43', the impedance of each signal path is increased, and by shortening the length L of the signal pattern 43', the transmission loss of each signal path is decreased. Furthermore, reducing both the width W1 of the signal pattern 43' and the width W2 of the comb-like grounding pattern 44' and thereby widening the gaps between adjacent signal paths of the signal pattern 43', improves the cross-talk prevention characteristics among the signal paths.

Furthermore, as shown in FIG. 7A, slits 44b' are formed by removing portions of the conductive layer aligned behind respective grounding paths in a middle portion of the grounding pattern 44' of the circuit board 41.' As the braided outer conductors 53 of the coaxial cables 5 described previously, are soldered sequentially onto the portions of the grounding pattern 44' located between these slits 44b' (hereinafter referred to as inter-slit portions), as shown in FIG. 4., the presence of these slits 44b' prevents the heat created by the soldering, from being conducted from one inter-slit portion to adjacent inter-slit portions thereby avoiding risk of heat from current soldering weakening previously soldered joints on adjacent braiding, ensuring a smooth trouble free braid soldering operation.

As shown in FIG. 7B, impedance can also be adjusted by placing a metal plate, an insulating plate or a conducting plate having conductive layers on an insulating plate, (all those plates are indicated with 46" in the figure), between the two circuit boards 41". Here, the circuit boards 41" can be double-sided, as described previously, or single-sided, having a conductive layer only on the front face. When double-sided circuit boards are utilized as the circuit boards 41", the grounding pattern provided on the rear face, which is connected with the grounding pattern 44" through the through-hole 41c", may cover the entire rear face or only surround the through-holes 41c". In addition, an interposed conducting plate, can be double-sided, i.e., an insulation plate with conductive layers on both face s, or single-sided, i.e., an insulation plate with a conductive layer only on the front face.

For example, the impedance of the entire signal pattern 43" can be lowered by interposing a metal plate between the two double-sided circuit boards 41". Furthermore, interposing a double-sided conduction plate between the double-sided circuit boards 41", enables the impedance of the signal pattern 43" to be adjusted positionally by providing a grounding pattern, i.e., a conductive layer, only at a predetermined position of the front face and rear face of the double-sided conduction plate or by removing portions of the conductive layer covering all the front or rear face of the double-sided conduction plate at predetermined positions.

Interposing a double-sided conduction plate forms a mediate circuit board assembly with four conductive layers; two layers contributed by the front face s of the two double-sided circuit boards 41" and two other grounding layers formed by the rear face s of the two double-sided circuit boards 41" abutted with the patterns of the interposed double-sided conduction plate.

Alternatively, when using single-sided circuit boards instead of double-sided circuit boards, the grounding patterns 44" may be connected to a metal plate and an interposed conduction plate by effective wiring.

Furthermore, interposing an insulation plate between the two single-sided circuit boards 41", enables the impedance of the entire signal patterns 43" to be increased. In addition, the material and thereby the permitivity or dielectric constant of the insulation plate can be changed to adjust the impedance without changing the thickness of the insulation plate, as reducing the permitivity increases the impedance.

When a metal plate, an insulation plate, or a conductive plate is interposed between the circuit boards 41", as described above, it is necessary to reduce the thickness of each circuit board 41" to accommodate the thickness of the interposed plate, so that the mediate circuit board assembly 4" as a whole has a thickness permitting receipt as a force fit between the rows of contacts 3.

What is claimed is:

1. An electrical connector of preselected impedance, in which common end portions of a plurality of signal cables are terminated, comprising:

a mediate circuit board assembly having a plurality of signal paths to which said common end portions of the signal cables are connected;

a housing for said mediate circuit board assembly; and a plurality of contacts retained in said housing and connected to respective signal paths;

said mediate circuit board assembly being constituted by two double-sided circuit boards, each board having at least said signal paths formed on a front face thereof and a grounding path formed on a rear face thereof, and the boards being mounted adjacent each other with their respective grounding paths abutting in face-to-face relation, electrically interconnected with each other, and so that the two circuit boards form a unitary mediate circuit board structure of preselected impedance.

2. The electrical connector set forth in claim 1 wherein said contacts are retained in said housing as two aligned rows and have respective contact portions protruding outward, and said mediate circuit board assembly is retained between the two rows of contacts as an interference fit therewith so that respective contact portions engage corresponding signal or grounding paths on the front face of said mediate circuit board assembly establishing electrical connection therewith.

3. The electrical connector set forth in claim 1 wherein each of said double-sided circuit boards comprises an insulating plate of predetermined thickness with the signal paths formed on the front face in alternating positions to grounding paths in a comb-like configuration and the grounding path covering an entire rear face thereof.

4. The electrical connector set forth in claim 3 wherein each said insulating plate is formed with a plated throughhole interconnecting grounding paths on said front and rear faces.

5. The electrical connector set forth in claim 3 wherein said signal cables are coaxial cables each having a braided outer conductor and a core wire, the braided outer conductors being connected to respective grounding paths of respective front faces, and the core wires of said coaxial cables being connected to respective signal paths on said front face.

\* \* \* \* \*